(12) United States Patent
Fan

(10) Patent No.: US 9,658,381 B2
(45) Date of Patent: May 23, 2017

(54) BACKLIGHT MODULE AND LIQUID CRYSTAL DISPLAY INCLUDING SAME

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 281 days.

(21) Appl. No.: 14/423,111

(22) PCT Filed: Jan. 7, 2015

(86) PCT No.: PCT/CN2015/070296
§ 371 (c)(1),
(2) Date: Feb. 21, 2015

(87) PCT Pub. No.: WO2016/082312
PCT Pub. Date: Jun. 2, 2016

(65) Prior Publication Data
US 2016/0341874 A1    Nov. 24, 2016

(30) Foreign Application Priority Data
Nov. 25, 2014    (CN) .......................... 2014 1 0687666

(51) Int. Cl.
*G02F 1/1333*    (2006.01)
*F21V 8/00*    (2006.01)
*H01L 33/50*    (2010.01)

(52) U.S. Cl.
CPC ......... *G02B 6/0026* (2013.01); *G02B 6/0088* (2013.01); *G02B 6/0091* (2013.01); *H01L 33/50* (2013.01); *G02B 6/0031* (2013.01); *G02B 6/0055* (2013.01)

(58) Field of Classification Search
None
See application file for complete search history.

(56) References Cited

U.S. PATENT DOCUMENTS

| | | | |
|---|---|---|---|
| 2008/0117367 A1* | 5/2008 | Abe ................... | G02F 1/13452 349/106 |
| 2013/0050612 A1* | 2/2013 | Hur ................... | G02F 1/133603 349/62 |
| 2014/0375897 A1* | 12/2014 | Sugiura ................ | G02B 6/0061 348/739 |

FOREIGN PATENT DOCUMENTS

| | | |
|---|---|---|
| CN | 102798038 A | 11/2012 |
| CN | 104155803 A | 11/2014 |

* cited by examiner

*Primary Examiner* — Richard Kim
(74) *Attorney, Agent, or Firm* — Andrew C. Cheng

(57) ABSTRACT

A backlight module includes a back plate having a side wall, a light guide plate disposed on the back plate and having a light incident surface, a light source disposed on the sidewall and adjacent to the light incident surface, a middle frame overlying the light guide plate and the light source, a first latching member disposed on a side of the middle frame facing toward the back plate and having a first groove, a second latching member disposed on a side of the back plate facing toward the middle frame and having a second groove, and a quantum bar, one end of which is latched in the first groove and the other end is latched in the second groove. The present invention also provides a LCD including the backlight module. The fixing manner of the quantum bar is simple and the cost is reduced.

20 Claims, 1 Drawing Sheet

BACKLIGHT MODULE AND LIQUID CRYSTAL DISPLAY INCLUDING SAME

TECHNICAL FIELD

The present invention relates to liquid crystal displays, and more particularly, relates to a backlight module and a liquid crystal display including the backlight module.

BACKGROUND

In the known liquid crystal displays (LCDs), white light emitting diodes (LEDs) are usually used as the backlight light source. Appropriate configuration of the light guide plate and the optical film can achieve the required backlight. Currently, the people's demand of high color gamut, high color saturation, and energy saving LCDs is increasing. Several techniques, for example, ultraviolet LEDs with red, green and blue florescent powder, or blue LEDs with red and green florescent powder, or blue LEDs with green LEDs and red LEDs, can achieve the white light source required by backlight of such LCDs. These techniques can increase the color gamut, however it is difficult to implement and the cost is also high.

Quantum dots (QD) is a type of semiconductor structure that is capable of restraining electrons within a certain range. Quantum dots usually consist of ultrafine compound crystals having a diameter of 1~100 nm. Quantum dots can control the wavelength of the light using the size of the crystals, thereby controlling the color of the light. Thus, quantum dots material is used in the backlight, the high frequency light source (i.e., blue LEDs) is used to replace the conventional white LEDs. The irradiation of quantum dots at the high frequency is low and can produce light of different wavelength after being irradiated by laser. By adjusting the size of the quantum dots material, the color the light mixed can be adjusted, and thus the backlight requirements of high color gamut LCDs is achieved.

FIG. 1 is a schematic view of a known backlight module using the quantum dots florescent powder film. As shown in FIG. 1, a blue LED 11 is disposed at a light incident side surface of a light guide plate 12, a quantum dots florescent powder film 13 is disposed at a light emitting surface of the light guide plate 12. The light emitted by the blue LED 11 is converted to surface light by the light guide plate 12, and is emitted from the light emitting surface of the light guide plate 12, then the light passing through the florescent powder film 13 is converted into the light source required by a LCD. However, in big-size LCDs, the area of the quantum dots florescent powder film 13 has is also very big, and thus a lot of quantum dots material is required. In addition, the florescent powder coating is also required to be very uniform, and therefore the cost is very high. Besides, if the optical film has a different configuration or a different model, the light after being processed by the optical film will have quite different color tone and brightness. Thus, the configuration, the supplier and the mode of the optical film shouldn't be easily changed during the using of the quantum dots florescent powder 13, and this significantly limits the flexibility and universality of quantum dots florescent powder film.

FIG. 2 is a schematic view of a known backlight module using the quantum dots florescent powder film. Referring to FIG. 2, a blue LED 21 is disposed at a light incident side surface of a light guide plate 22, quantum dots florescent powder is packaged in a glass tube to form a quantum dots florescent powder glass tube 23. The quantum dots florescent powder glass tube 23 is disposed between the blue LED 21 and the light incident surface of the light guide plate 22. The light emitted by the blue LED 21 passes through the quantum dots florescent powder glass tube 23 and irradiated the light incident surface of the light guide plate 22. However, it is complicated to manufacture the quantum dots florescent powder glass tube 23 and the cost is high, and the quantum dots florescent powder glass tube 23 is easily broken.

SUMMARY

To solve the above problems in the existing art, an embodiment of the present invention provides a backlight module. The backlight module includes a back plate, having at least one sidewall; a light guide plate, disposed on the back plate and having at least one light incident surface; a light source disposed on the sidewall and being adjacent to the light incident surface; a middle frame, overlying the light guide plate and the light source; a first latching element, disposed at a side of the middle frame facing toward the back plate and having at least one first groove, the first groove being between the light source and the light incident surface; a second latching member, disposed a side of the back plate facing toward the middle frame and having at least one second groove, the second groove being disposed opposite to the first grove; and a quantum bar. One end of the quantum bar is latched in the first groove and the other end of the quantum bar is latched in the second groove.

In one embodiment, an installing groove is formed in a side of the middle frame facing toward the back plate. One end of the installing groove butts against the sidewall and the other end of the installing groove is located on the light guide plate. The first latching member is installed in the installing groove.

In one embodiment, the backlight module further includes a first reflective layer, disposed on a side of the first latching member facing toward the back plate, and between the sidewall and the first groove.

In one embodiment, the backlight module further includes a second reflective layer, disposed on a side of the second latching member facing toward the back plate, and between the sidewall and the second groove.

In one embodiment, the backlight module further includes a third reflective layer, disposed on a side of the first latching member facing toward the back plate. One end of the third reflective layer butts against the quantum bar and the other end of the third reflective layer is disposed between the middle frame and the light guide plate.

In one embodiment, the backlight module further includes a light absorbing layer, disposed between the middle frame and the light guide plate.

In one embodiment, a number of protrusions are disposed on a side of the back plate facing toward the light guide plate. The protrusions have a same height to the second latching member. The light guide plate is disposed on the protrusions, and a light incident end of the light guide plate is disposed on the second latching member.

In one embodiment, the backlight module further includes a reflective plate, disposed between the light guide plate and the back plate. One end of the reflective plate butts against the quantum bar.

An embodiment of the present invention also provides a liquid crystal display, including a backlight module and a LCD panel disposed opposite to the backlight module. The backlight module provides light source to the LCD panel thereby enabling the LCD panel to display images. The backlight module is a backlight module as described above.

The present invention utilizes latching members disposed on the middle frame and the back plate to fix the quantum bar. The fixing manner is simple and the cost can be reduced. The problem that the quantum dots florescent powder glass tube is easily broken in the known art doesn't exists now. In addition, reflective layers are disposed near to the quantum bar, a light coupling efficiency is improved, the number of light sources can be reduced, and the cost is further saved.

BRIEF DESCRIPTION OF THE DRAWINGS

The above and other aspects, and characteristics of embodiments of the present invention will become more clearly according to the description below accompanying with the figures, in which.

DETAILED DESCRIPTION OF PREFERRED EMBODIMENTS

The embodiments of the present invention are described in detail with the reference to the figures. However, the present invention can be carried out in many other manners, and the present invention shouldn't be interpreted as only the described embodiment. In contrast, the provided embodiments are used to explain the principle and spirit of the present invention and the practical application of the present invention, thereby enabling those ordinarily skilled in the art to understand the embodiments of the present invention and make modifications to the embodiments for an specific application.

Figure 1:
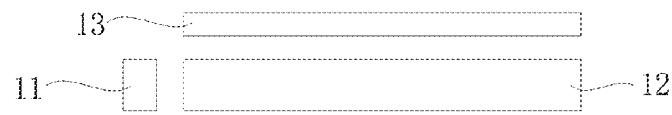
FIG. 1 is a schematic view of a known backlight module using the quantum dots florescent powder film.
Figure 2:
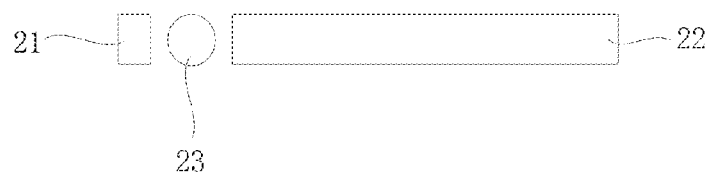
FIG. 2 is a schematic view of another known backlight module using the quantum dots florescent powder film.
Figure 3:
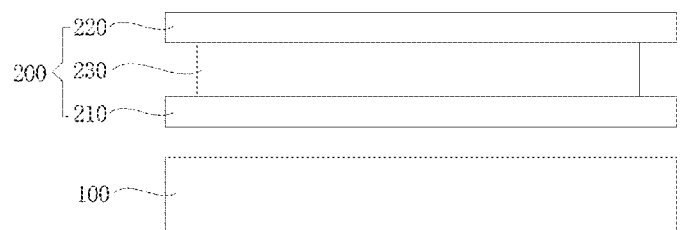
FIG. 3 is a schematic view of a liquid crystal display according to one embodiment of the present invention.

FIG. 3 is a schematic view of a liquid crystal display according to one embodiment of the present invention.

Referring to FIG. 3, a LCD provided in the present embodiment includes a LCD panel 200 and a backlight module 100 disposed opposite to the LCD panel 200. The backlight module 100 provides light source to eh LCD panel 20, enabling the LCD panel 200 to display images.

The LCD panel 200 usually includes a thin film transistor (TFT) array substrate 210, a color filter (CF) substrate 220 disposed opposite to the TFT substrate 210, and a liquid crystal layer 230 interposed between the TFT substrate 210 and the CF substrate 220. The liquid crystal layer 230 includes a number of liquid crystal molecules. Since the LCD panel 200 of the present embodiment has a structure substantially same to the LCD panel in the existing art, and thus is not further described here.

The structure of the backlight module 100 provided by the embodiment of the present invention is describe in detail as follows.

Fig. is a schematic view of a backlight module according to one embodiment of the present invention.

Figure 4:
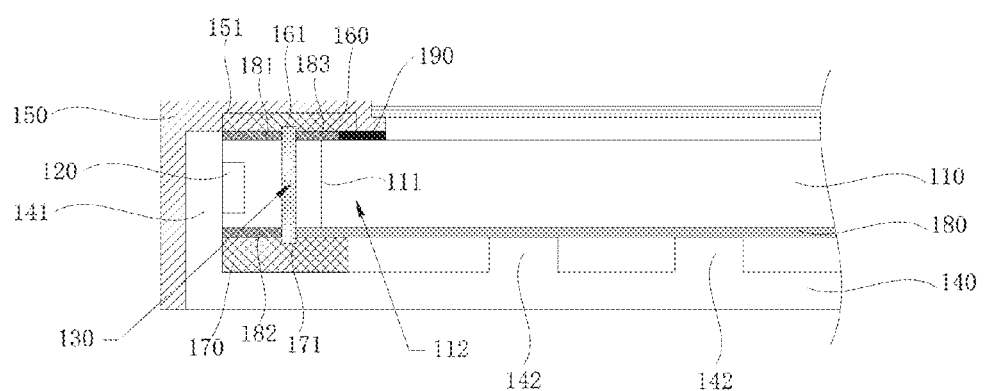
FIG. 4 is a schematic view of a backlight module according to one embodiment of the present invention.

Referring to FIG. 4, the backlight module 100 provided by the present embodiment includes a light guide late 110, a light source 120, a quantum dots film bar (hereinafter quantum bar) 130, a back plate 140, a middle frame 150, a first latching member 160 and a second latching member 170.

Specifically, the back plate 140 includes at least one sidewall 141. The light guide plate 110 is supported by the back plate 140, and the light guide plate 110 includes a light incident surface 111. The light incident surface 111 and the sidewall 141 of the back plate 140 are opposite to each other.

The light source 120, for example, is a LED bar consists of blue LEDs. The light source 120 is installed on the sidewall of the back plate 140 and is adjacent to the light incident surface 111. The middle frame 150 covers on the light guide plate 110 and the light source 120, and an installing groove 151 is formed on a side of the middle frame 150 facing toward the back plate 140. One end of the installing groove butts against the sidewall 141 of the back plate 140, and the other end of the installing groove 151 is disposed on the light guide plate 110.

The first latching member 160 is installed in the installing groove 151. In other words, the first latching member 160 is disposed on a side of the middle frame 150 facing toward the back plate 140. The first latching member 160 includes a first groove 161. The first groove 161 is between the light source 120 and the light incident surface 111 of the light guide plate. In the present invention, the installing manner of the first latching member 160 is not limited as the manner shown in FIG. 4.

The second latching member 170 is fixed on a side of the back plate 140 facing toward the middle frame 150. The second latching member 170 includes a second groove 171. The second groove 171 is disposed opposite to the first groove 161. In the present embodiment, preferably, the first groove 161 is aligned to the second groove 171. In addition, the number of the first groove 161 and the second groove 171 is not limited as the number shown in FIG. 4, and can be increased or reduced according to the number of the quantum bar 130.

To reduce the manufacturing cost of the first latching member 160 and the second latching member 170, in the present embodiment, preferably, the first latching member 160 and the second latching member 170 are made of heat resistant and light resistant materials such as plastics, rubber or silicone, but material is not limited as the examples.

The quantum bar 130, for example, consists of a quantum dots florescent powder layer and a transparent protective layer enclosing the quantum dots florescent powder layer. One end of the quantum bar 130 is latched in the first groove 161, and the other end of the quantum bar 130 is latched in the second groove 171. The light source 120 irradiates the quantum dots florescent powder layer in the quantum bar 130, the quantum dots florescent powder layer is excited to produce light of different colors, thereby producing the white light required by the backlight of LCD panel.

In addition, to improve the light coupling efficiency, the backlight module 100 of the present embodiment may further include a first reflective layer 181. The first reflective layer 181 is disposed on a side of the first latching member 160 facing toward the back plate 140, and the first reflective layer 181 is between the sidewall 141 of the back plate 140 and the first groove 161.

In addition, the backlight module 100 of the present embodiment may further include a second reflective layer 182. The second reflective layer 182 is disposed on a side of the second latching member 170 facing toward the middle frame 150, and the second reflective layer 182 is between the sidewall 141 of the back plate 140 and the second groove 171.

In addition, the backlight module 100 of the present embodiment may further include a third reflective layer 183. The third reflective layer 183 is disposed on a side of the first latching member 160 facing toward the back plate 140. One end of the third reflective layer 183 butts against the quantum bar 130, and the other end of the third reflective layer 183 is disposed between the middle frame 150 and the light guide plate 110.

In the present embodiment, the first reflective layer 181, the second reflective layer 182 and the third reflective layer 183 may be formed by a high reflective metal material such as silver, but is not limited as the example.

In addition, to prevent the light leakage between the middle frame 150 and the light guide plate 11, in the present embodiment, the backlight module 100 of the present embodiment may further includes a light absorbing layer 190. The light absorbing layer 190 is disposed between the middle frame 150 and the light guide plate 110. One end of the light absorbing layer 190 butts against the third reflective layer 183. The light absorbing layer 190, for example, is a black film, but is not limited to the black film.

To improve the heat dissipation ability of the backlight module 100, the back plate 140 can be made by a metal material having excellent heat conductivity. In the present embodiment, the back plate 140 is made of aluminum. To further improve the heat dissipation ability of the parts of the backlight module such as light guide plate 110, in the present embodiment, a number of protrusions 142 are disposed on a side of the back plate 140 facing toward the light guide plate 11. The protrusions 142 have a same height to the second latching member 170. The light guide plate 110 is disposed on the protrusions, and a light incident end 112 of the light guide plate 110 is disposed on the second latching member 170. As such, a gap is formed between the light guide plate 110 and the back plate 140, and thus the heat dissipation efficiency is further improved.

Besides, the backlight module 100 of the present embodiment may further includes a reflective plate 180. The reflective plate 180 is disposed between the light guide plate 110 and the protrusions 142 of the back plate 14-. One end of the reflective plate 180 butts against the quantum bar 130. The reflective plate 180 is configured for reflecting the light emitted from a bottom surface of the light guide plate back to the light guide plate thereby improving the light efficiency of the light guide plate 110.

In summary, the embodiments of the present invention utilize latching members disposed on the middle frame and the back plate to fix the quantum bar. The fixing manner is simple and the cost can be reduced. The problem that the quantum dots florescent powder glass tube is easily broken in the known art doesn't exists now. In addition, reflective layers are disposed near to the quantum bar, a light coupling efficiency is improved, the number of light sources can be reduced, and the cost is further saved.

Although the present invention is described referring to specific embodiments, but it is to be understood by those ordinarily skilled in the art, formal or small changes can be made to the embodiments within the spirit and scope of the present invention as recited in the claims and their equivalents.

What is claimed is:

1. A backlight module, comprising:
a back plate, comprising at least one sidewall;
a light guide plate, disposed on the back plate and comprising at least one light incident surface;
a light source, disposed on the sidewall and being adjacent to the light incident surface;
a middle frame, disposed overlying the light guide plate and the light source;
a first latching member, disposed at a side of the middle frame facing toward the back plate and comprising at least one first groove, the first groove being between the light source and the light incident surface;
a second latching member, disposed a side of the back plate facing toward the middle frame and comprising at least one second groove, the second groove being disposed opposite to the first groove; and
a quantum bar, one end of the quantum bar being latched in the first groove and the other end of the quantum bar being latched in the second groove;
wherein an installing groove is formed in a side of the middle frame facing toward the back plate, one end of the installing groove abutting against the sidewall and the other end of the installing groove being located on the light guide plate, the first latching member being installed in the installing groove.

2. The backlight module of claim 1, wherein the backlight module further comprises a first reflective layer, disposed on a side of the first latching member facing toward the back plate, and between the sidewall and the first groove.

3. The backlight module of claim 1, wherein the backlight module further comprises a second reflective layer, disposed on a side of the second latching member facing toward the back plate, and between the sidewall and the second groove.

4. The backlight module of claim 3, wherein the backlight module further comprises a third reflective layer, disposed on a side of the first latching member facing toward the back plate, one end of the third reflective layer abutting against the quantum bar and the other end of the third reflective layer being disposed between the middle frame and the light guide plate.

5. The backlight module of claim 1, wherein the backlight module further comprises a third reflective layer, disposed on a side of the first latching member facing toward the back plate, one end of the third reflective layer abutting against the quantum bar and the other end of the third reflective layer being disposed between the middle frame and the light guide plate.

6. The backlight module of claim 1, wherein the backlight module further comprises a light absorbing layer, disposed between the middle frame and the light guide plate.

7. The backlight module of claim 1, wherein a number of protrusions are disposed on a side of the back plate facing toward the light guide plate, the protrusions have a same height to the second latching member, the light guide plate being disposed on the protrusions, and a light incident end of the light guide plate being disposed on the second latching member.

8. The backlight module of claim 7, wherein the backlight module further comprises a reflective plate, disposed between the light guide plate and the back plate, one end of the reflective plate abutting against the quantum bar.

9. The backlight module of claim 1, wherein the backlight module further comprises a reflective plate, disposed between the light guide plate and the back plate, one end of the reflective plate abutting against the quantum bar.

10. A liquid crystal display, comprising a backlight module and a liquid crystal display panel disposed opposite to the backlight module, the backlight module providing light source to the liquid crystal display panel thereby enabling the liquid crystal display panel to display images, the backlight module comprising:
a back plate, comprising at least one sidewall;
a light guide plate, disposed on the back plate and comprising at least one light incident surface;
a light source, disposed on the sidewall and being adjacent to the light incident surface;

a middle frame, disposed overlying the light guide plate and the light source;

a first latching member, disposed at a side of the middle frame facing toward the back plate and comprising at least one first groove, the first groove being between the light source and the light incident surface;

a second latching member, disposed a side of the back plate facing toward the middle frame and comprising at least one second groove, the second groove being disposed opposite to the first groove; and a quantum bar, one end of the quantum bar being latched in the first groove and the other end of the quantum bar being latched in the second groove;

wherein an installing groove is formed in a side of the middle frame facing toward the back plate, one end of the installing groove abutting against the sidewall and the other end of the installing groove being located on the light guide plate, the first latching member being installed in the installing groove.

11. The liquid crystal display of claim 10, wherein the backlight module further comprises a first reflective layer, disposed on a side of the first latching member facing toward the back plate, and between the sidewall and the first groove.

12. The liquid crystal display of claim 10, wherein the backlight module further comprises a second reflective layer, disposed on a side of the second latching member facing toward the back plate, and between the sidewall and the second groove.

13. The liquid crystal display of claim 12, wherein the backlight module further comprises a third reflective layer, disposed on a side of the first latching member facing toward the back plate, one end of the third reflective layer abutting against the quantum bar and the other end of the third reflective layer being disposed between the middle frame and the light guide plate.

14. The liquid crystal display of claim 10, wherein the backlight module further comprises a third reflective layer, disposed on a side of the first latching member facing toward the back plate, one end of the third reflective layer abutting against the quantum bar and the other end of the third reflective layer being disposed between the middle frame and the light guide plate.

15. The liquid crystal display of claim 10, wherein the backlight module further comprises a light absorbing layer, disposed between the middle frame and the light guide plate.

16. The liquid crystal display of claim 10, wherein a number of protrusions are disposed on a side of the back plate facing toward the light guide plate, the protrusions have a same height to the second latching member, the light guide plate being disposed on the protrusions, and a light incident end of the light guide plate being disposed on the second latching member.

17. The liquid crystal display of claim 16, wherein the backlight module further comprises a reflective plate, disposed between the light guide plate and the back plate, one end of the reflective plate abutting against the quantum bar.

18. The liquid crystal display of claim 10, wherein the backlight module further comprises a reflective plate, disposed between the light guide plate and the back plate, one end of the reflective plate abutting against the quantum bar.

19. A liquid crystal display, comprising a backlight module and a liquid crystal display panel disposed opposite to the backlight module, the backlight module providing light source to the liquid crystal display panel thereby enabling the liquid crystal display panel to display images, the backlight module comprising:

a back plate, comprising at least one sidewall;

a light guide plate, disposed on the back plate and comprising at least one light incident surface;

a light source, disposed on the sidewall and being adjacent to the light incident surface;

a middle frame, disposed overlying the light guide plate and the light source;

a first latching member, disposed at a side of the middle frame facing toward the back plate and comprising at least one first groove, the first groove being between the light source and the light incident surface;

a second latching member, disposed a side of the back plate facing toward the middle frame and comprising at least one second groove, the second groove being disposed opposite to the first groove; and a quantum bar, one end of the quantum bar being latched in the first groove and the other end of the quantum bar being latched in the second groove;

wherein a number of protrusions are disposed on a side of the back plate facing toward the light guide plate, the protrusions have a same height to the second latching member, the light guide plate being disposed on the protrusions, and a light incident end of the light guide plate being disposed on the second latching member.

20. The liquid crystal display of claim 19, wherein the backlight module further comprises a reflective plate, disposed between the light guide plate and the back plate, one end of the reflective plate abutting against the quantum bar.

* * * * *